United States Patent
Baek (10) Patent No.: US 10,180,465 B2
(45) Date of Patent: Jan. 15, 2019

(54) NOISE INSPECTION APPARATUS

(71) Applicant: Samsung Electronics Co., Ltd., Gyeonggi-do (KR)

(72) Inventor: Hyunho Baek, Gyeonggi-do (KR)

(73) Assignee: Samsung Electronics Co., Ltd (KR)

( * ) Notice: Subject to any disclaimer, the term of this patent is extended or adjusted under 35 U.S.C. 154(b) by 93 days.

(21) Appl. No.: 15/161,839

(22) Filed: May 23, 2016

(65) Prior Publication Data

US 2016/0341796 A1    Nov. 24, 2016

(30) Foreign Application Priority Data

May 21, 2015    (KR) .................. 10-2015-0071192

(51) Int. Cl.
  *G01R 31/40*  (2014.01)
  *G01R 29/26*  (2006.01)
  *G01R 31/44*  (2006.01)
(52) U.S. Cl.
  CPC ............. *G01R 31/40* (2013.01); *G01R 29/26* (2013.01); *G01R 31/44* (2013.01)
(58) Field of Classification Search
  CPC ............. G01R 19/257; G01R 31/2884; G01R 31/3004; G01R 31/3181; G01R 31/31813
  See application file for complete search history.

(56) References Cited

U.S. PATENT DOCUMENTS

| | | | |
|---|---|---|---|
| 2002/0133748 A1 | 9/2002 | Corr | |
| 2005/0007126 A1 | 1/2005 | Corr | |
| 2006/0164059 A1* | 7/2006 | Dreps | G01R 19/16552 323/312 |
| 2010/0156436 A1 | 6/2010 | Nakao | |
| 2011/0193589 A1* | 8/2011 | Chua-Eoan | G01R 29/26 326/16 |
| 2012/0049947 A1 | 3/2012 | Arsovski et al. | |

OTHER PUBLICATIONS

Maksimovic, Dragan et al., Switched-Capacitor DC-DC Converters for Low-Power On-Chip Applications, Copyright 1999 IEEE, pp. 54-59.
Alon, Elad et al., Circuits and Techniques for High-Resolution Measurement of On-Chip Power Supply Noise.
IEEE Journal of Solid-State Circuits, vol. 40, No. 4, Apr. 2005, Copyright 2005 IEEE, pp. 820-828.

(Continued)

*Primary Examiner* — Tung X Nguyen
(74) *Attorney, Agent, or Firm* — The Farrell Law Firm, P.C.

(57) ABSTRACT

Disclosed is an inspection apparatus for inspecting a chip for noise, including an inspection circuit that is connected to a first power line of the chip and that receives a signal to be inspected, wherein the first voltage is applied to the first power line and the signal to be inspected includes noise having a second voltage, and a voltage doubler that is connected to the first power line and boosts a voltage of driving power having the first voltage, wherein the inspection circuit may be driven by the driving power, the voltage of the driving power is boosted by the voltage doubler, and the inspection circuit inspects the chip for the noise of the signal to be inspected.

15 Claims, 10 Drawing Sheets

(56) References Cited

OTHER PUBLICATIONS

Chansungsan, Chaiyuth, Auto-Referenced On-Die Power Supply Noise Measurement Circuit, IEEE 2005 Custom Integrated Circuits Conference, Copyright 2005 IEEE, pp. 39-42.
Maksimovic, Dragan et al., Switched-Capacitor DC-DC Coverters for Low-Power On-Chip Applications, Copyright 1999 IEEE, pp. 54-59.
McCreary, James L. et al., All-MOS Charge Redistribution Analog-to-Digital Conversion Techniques-Part 1.
IEEE Journal of Solid-State Circuits, vol. SC-10, No. 6, Dec. 1975, pp. 371-379.

\* cited by examiner

NOISE INSPECTION APPARATUS

PRIORITY

This application claims priority under 35 U.S.C. § 119(a) to Korean Application Serial No. 10-2015-0071192, which was filed in the Korean Intellectual Property Office on May 21, 2015, the contents of which are incorporated herein by reference.

BACKGROUND

1. Field of the Disclosure

The present disclosure relates generally to a noise inspection apparatus, and more particularly, to an inspection apparatus for inspecting a previously-manufactured chip for noise.

2. Description of the Related Art

Technology for an inspection apparatus for inspecting a previously-manufactured chip for noise has been actively developed. A chip includes multiple power lines, and an existing inspection apparatus is connected to the multiple power lines and inspects the chip for noise. For example, the chip includes a first power line, to which a first voltage is applied, and a second power line to which a second voltage is applied. The existing inspection apparatus is connected to both the first power line and the second power line, may acquire a signal from the first power line and a signal from the second power line, and inspects the chip for noise. The existing inspection apparatus inspects the chip for noise having a voltage higher than the first voltage, on the basis of the signal from the second power line.

As described above, the existing inspection apparatus is connected to multiple power lines and inspects a chip for noise. However, a coupling effect due to the multiple power lines tends to occur, which causes the existing inspection apparatus to have difficulty in accurately inspecting a chip for noise.

Also, a complex pattern on a die must be designed in order to connect the existing inspection apparatus to the multiple power lines. Particularly, power supply noise may be coupled to a resonant structure, which generates common mode noise, such as cross-talk, simultaneous switching noise, signal reflection, and plane noise-induced signal resonance. As such, there is a need in the art for a simplified apparatus that more accurately inspects chips for noise.

SUMMARY

The present disclosure has been made to address the above-mentioned problems and disadvantages, and to provide at least the advantages described below.

Accordingly, an aspect of the present disclosure is to provide an inspection apparatus that is connected to a single power line and performs a noise inspection, thereby alleviating a coupling effect caused by being connected to multiple power lines.

In accordance with an aspect of the present disclosure, an inspection apparatus for inspecting a chip for noise includes an inspection circuit that is connected to a first power line of the chip and that receives a signal to be inspected, wherein a first voltage is applied to the first power line and the signal to be inspected includes noise having a second voltage, and a voltage doubler that is connected to the first power line and boosts a voltage of driving power having the first voltage, wherein the inspection circuit is driven by the driving power, the voltage of the driving power is boosted by the voltage doubler, and the inspection circuit inspects the at least one element of the chip for the noise of the signal to be inspected.

In accordance with another aspect of the present disclosure, a chip includes a die, at least one element that is formed on the die, and an inspection apparatus that is formed on the die and inspects the at least one element for noise, wherein the inspection apparatus comprises an inspection circuit that is connected to a first power line of the chip and that receives a signal to be inspected, wherein a first voltage is applied to the first power line and the signal to be inspected includes a second voltage, and a voltage doubler that is connected to the first power line and boosts a voltage of driving power having the first voltage, wherein the inspection circuit is driven by the driving power, the voltage of the driving power is boosted by the voltage doubler, and the inspection circuit inspects the at least one element for the noise of the signal to be inspected.

BRIEF DESCRIPTION OF THE DRAWINGS

The above and other aspects, features, and advantages of the present disclosure will be more apparent from the following detailed description taken in conjunction with the accompanying drawings, in which.

DETAILED DESCRIPTION OF EMBODIMENTS OF THE DISCLOSURE

Hereinafter, embodiments of the present disclosure will be described with reference to the accompanying drawings. However, it should be understood that there is no intent to limit the present disclosure to the particular forms disclosed herein rather, the present disclosure should be construed to cover various modifications, equivalents, and/or alternatives of embodiments of the present disclosure. In the description of the drawings, similar reference numerals may be used to designate similar elements. A detailed description of known functions or configurations will be omitted for the sake of clarity and conciseness.

As used herein, the expressions "have", "may have", "include", and "may include" refer to the existence of a corresponding numeral, function, operation, or component, and do not exclude one or more additional features.

In the present disclosure, the expressions "A or B", "at least one of A or/and B", and "one or more of A or/and B" include all possible combinations of the items listed. For example, the expressions "A or B", "at least one of A and B", and "at least one of A or B" refer to all of (1) including at least one A, (2) including at least one B, and (3) including all of at least one A and at least one B.

The expressions "a first", "a second", "the first", and "the second" used in embodiments of the present disclosure may modify various components regardless of the order and/or the importance but do not limit the corresponding components. For example, a first user device and a second user device indicate different user devices although both are user devices. A first element may be referred to as a second element, and similarly, a second element may be referred to as a first element without departing from the scope of the present disclosure.

It should be understood that when a first element is referred to as being operatively or communicatively "connected" or "coupled" to another element, such as a second element, it may be directly connected or coupled directly to the second element or to any third element that may be interposed between the first and second elements. In contrast, it may be understood that when the first element is referred to as being "directly connected" or "directly coupled" to the second element, there is no third element interposed between the first and second elements.

The expression "configured to" used in the present disclosure may be used interchangeably with "suitable for", "having the capacity to", "designed to", "adapted to", "made to", or "capable of" according to the situation. The term "configured to" may not necessarily imply "specifically designed to" in hardware. Alternatively, in some situations, the expression "device configured to" may indicate that the device, together with other devices or components, "is able to". For example, the phrase "processor adapted (or configured) to perform A, B, and C" may indicate an embedded processor only for performing the corresponding operations or a generic-purpose central processing unit (CPU) or application processor (AP) that can perform the corresponding operations by executing one or more software programs stored in a memory device.

The terms used herein are merely for the purpose of describing particular embodiments and are not intended to limit the scope of other embodiments. As used herein, singular forms also include plural forms unless the context clearly indicates otherwise. Unless defined otherwise, all terms used herein, including technical and scientific terms, have the same meaning as those commonly understood by a person skilled in the art to which the present disclosure pertains. Such terms as those defined in a typical dictionary may be interpreted to have the same meanings as the contextual meanings in the relevant field of art, and are not to be interpreted to have ideal or excessively formal meanings unless clearly defined in the present disclosure. In some cases, even the terms defined in the present disclosure should not be interpreted to exclude embodiments of the present disclosure.

Embodiments of the present disclosure provide an inspection apparatus that is connected to a single power line and performs a noise inspection. Accordingly, the embodiments herein alleviate a coupling effect caused by being connected to multiple power lines, the design of a complex pattern, and a common mode noise problem. The inspection apparatus can ensure an inspection range of noise up to ±25% over a driving voltage, for example.

Figure 1A:
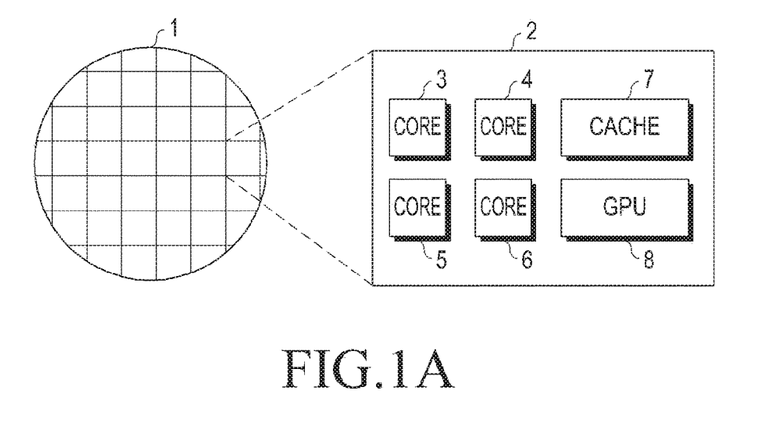
FIGS. 1A, 1B and 1C illustrate conceptual views for explaining a comparative example for a comparison with the present disclosure.
Figure 1B:
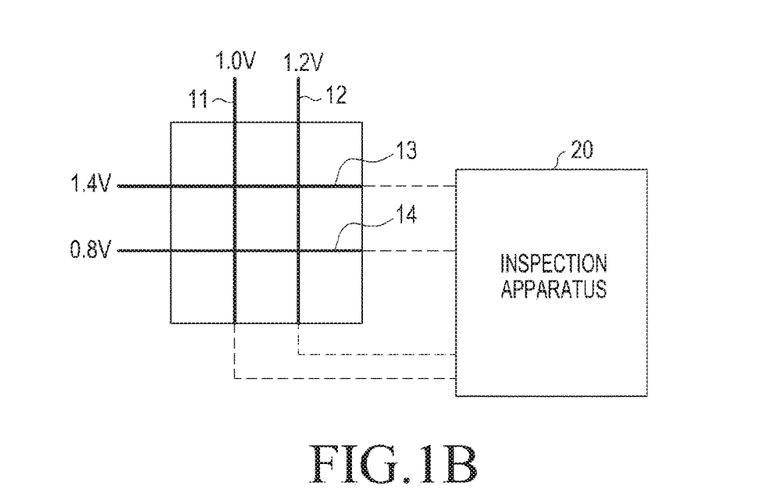
Figure 1C:
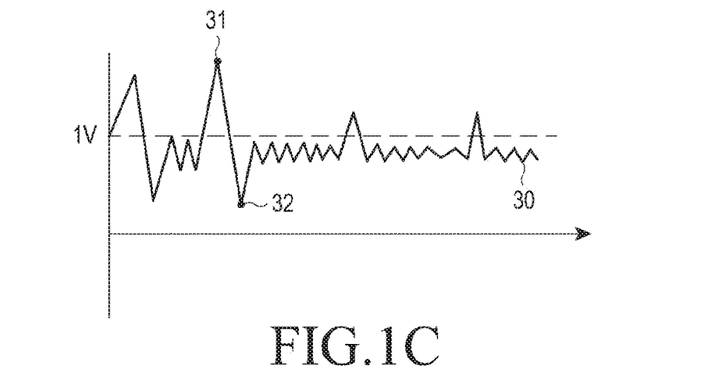

FIGS. 1A, 1B and 1C illustrate conceptual views for explaining a comparative example for a comparison with the present disclosure.

Referring to FIG. 1A, multiple chips 2 may be formed on a die 1. The chip 2 includes at least one core 3 to 6, a cache 7, and a graphics processing unit (GPU) 8. The at least one core 3 to 6, the cache 7, and the GPU 8 may be disposed on the die 1 according to a pattern of the multiple chips 2 and a pattern of an individual element.

Referring to FIG. 1B, at least one element such as the core 3, includes multiple power lines 11, 12, 13, and 14. Different voltages is applied to the respective multiple power lines 11, 12, 13, and 14. For example, 1.0 volts (V) is applied to the first power line 11, 1.2 V is applied to the second power line 12, 1.4 V is applied to the third power line 13, and 0.8 V is applied to the fourth power line 14. An inspection apparatus 20 according to a comparative example is connected to all of the first power line 11, the second power line 12, the third power line 13, and the fourth power line 14.

The inspection apparatus 20 inspects the first power line 11 for noise 30 as illustrated in FIG. 1C. The noise 30 includes a first peak 31 and a second peak 32. For example, with 1 V as a reference, the first peak 31 may have a value of 1.2 V and the second peak 32 may have a value of 0.8 V. The inspection apparatus 20 according to the comparative example receives driving power applied by the second power line 12, and accordingly, measures a value of 1.2 V. When receiving driving power applied by the first power line 11, the inspection apparatus 20 according to the comparative example may not measure 1.2 V which is the voltage of the first peak 31 which exceeds 1.0 V which is the value of a voltage applied to the first power line 11. Accordingly, the inspection apparatus 20 according to the comparative example receives and is driven by power from each of the multiple power lines 12 and 13, to which a voltage exceeding 1.0 V is applied, as well as the power line to which 1.0 V is applied. As described above, the inspection apparatus 20 according to the comparative example is connected to the multiple power lines 11 to 14 and receives driving power, which causes a coupling effect, a complex design pattern, and a common mode noise problem.

Figure 2A:
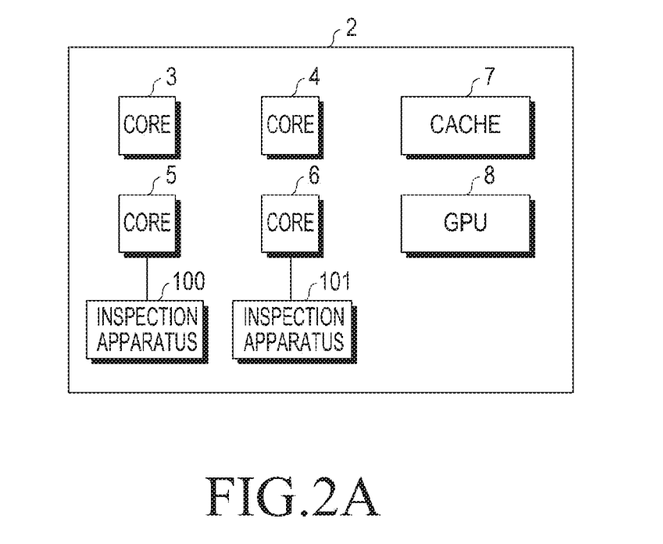
FIGS. 2A, 2B and 2C illustrate conceptual views for explaining an inspection apparatus according to embodiments of the present disclosure.
Figure 2B:
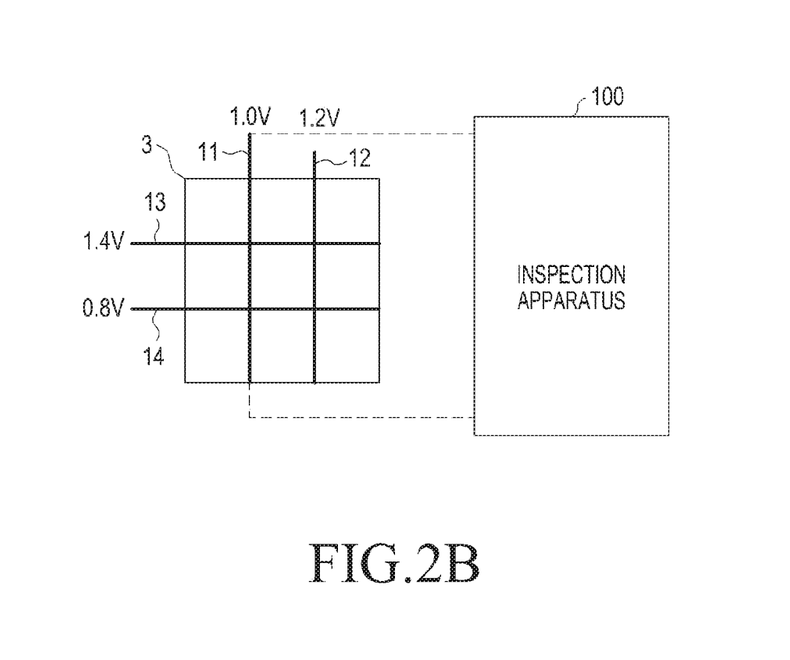
Figure 2C:
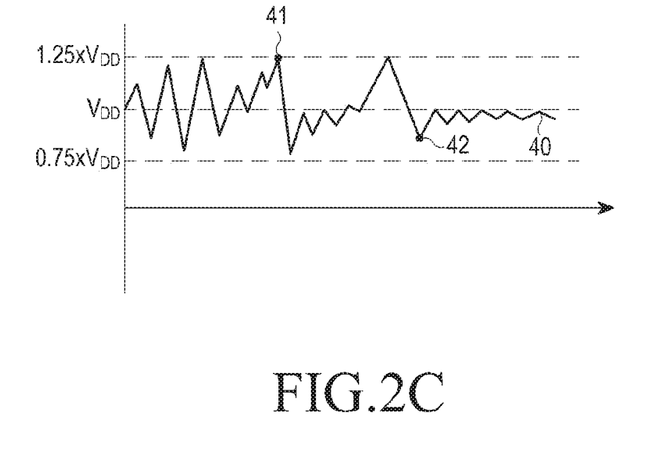

FIGS. 2A, 2B and 2C illustrate conceptual views for explaining an inspection apparatus according to embodiments of the present disclosure.

Referring to FIG. 2A, at least one core 3 to 6, a cache 7, and a GPU 8 are disposed on a previously-manufactured chip 2. Inspection apparatuses 100 and 101 according to embodiments of the present disclosure may be disposed in white space of the chip 2. The inspection apparatuses 100 and 101 are generated on the chip 2 in an on-die scheme, and may be manufactured to be detachable/attachable from/to the chip 2 and to be connectable to an individual element.

The inspection apparatuses 100 and 101 being connected to only some of the multiple elements 3 to 8 of the previously-manufactured chip 2 is only an example, and the apparatuses 100 and 101 may be connected to the respective elements 3 to 8. Alternatively, one inspection apparatus may be implemented not to be connected to the multiple elements.

Referring to FIG. 2B, the inspection apparatus 100 is connected to one power line of the core 3, i.e., to the first power line 11. Specifically, the inspection apparatus 100 receives driving power having a voltage identical to a voltage applied to a signal from a power line of a subject to be inspected. As illustrated in FIG. 2B, the inspection apparatus 100 is connected to the first power line 11, receives a signal from a subject to be measured, and also receives driving power. In an embodiment of the present disclosure, the inspection apparatus 100 is connected to the first power line 11 and receives a signal from a subject to be measured, and receives driving power having a voltage identical to a voltage which is applied to the first power line 11 by another source.

As described above, the inspection apparatus 100 uses the driving power having the voltage identical to that of the subject to be inspected. Accordingly, the coupling effect, complex design pattern, and common mode noise problem which occur in the comparative example are cured.

Referring to FIG. 2C, the inspection apparatus 100 inspects a chip for noise 40 included in a range from a voltage 0.75 times a voltage $V_{DD}$ of driving power to a voltage 1.25 times the voltage $V_{DD}$ of the driving power. Accordingly, peaks 41 and 42 included in the range may be measured by the inspection apparatus 100, as described below.

Figure 3:
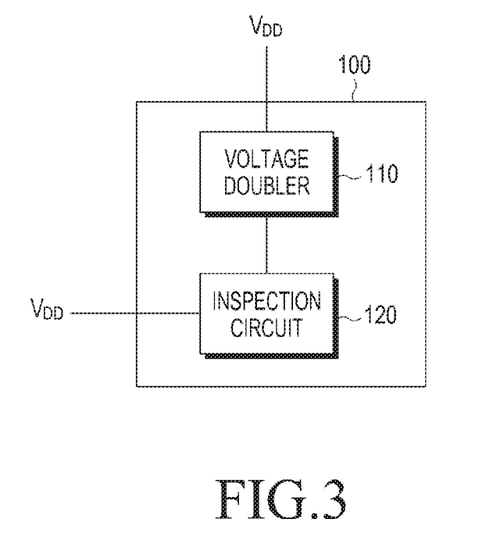
FIG. 3 illustrates a configuration of an inspection apparatus according to embodiments of the present disclosure.

FIG. 3 illustrates a configuration of an inspection apparatus according to embodiments of the present disclosure.

Referring to FIG. 3, the inspection apparatus 100 includes a voltage doubler 110 and an inspection circuit that receives a signal for a noise inspection. In the present example, consideration may be given to when the voltage $V_{DD}$ is applied to a power line to be inspected for noise. Accordingly, noise that fluctuates with the voltage $V_{DD}$ as a reference in the power line to be inspected for noise is generated. Specifically, noise having voltages including the voltage $V_{DD}$ is generated in the power line to be inspected for noise, and at least some of the noise may have a voltage higher than the voltage $V_{DD}$. In other words, the noise may have a first range including the voltage $V_{DD}$.

The voltage doubler 110 boosts the voltage $V_{DD}$ of input driving power. In an embodiment of the present disclosure, the voltage doubler 110 doubles the voltage $V_{DD}$ of the driving power and outputs the doubled voltage. Accordingly, the inspection circuit 120 receives driving power having a voltage of $2 \times V_{DD}$. The inspection circuit 120 may be driven by the driving power having the voltage of $2 \times V_{DD}$, and measures noise having a voltage higher than the voltage $V_{DD}$. The voltage doubler 110 doubling the voltage of the input power is only an example, and there is no limit on a step-up gain. In the present example, the boosted voltage may be higher than a maximum value of the noise. The voltage doubler 110 may be designed as two opposite-phase switched capacitors that are connected in parallel.

As described above, the inspection apparatus 100 is connected to one power line, receives a signal and driving power from the subject to be inspected, and performs a noise inspection. Alternatively, the inspection apparatus 100 uses driving power of a first voltage in order to measure noise in a first range including the first voltage (VDD). In the present example, the first range fluctuates with the first voltage as a reference. Accordingly, the inspection apparatus 100 is connected to one power line and receives a signal and driving power from the subjected to be inspected, which cures the conventional coupling effect, complex design pattern and common mode noise problems.

Figure 4:
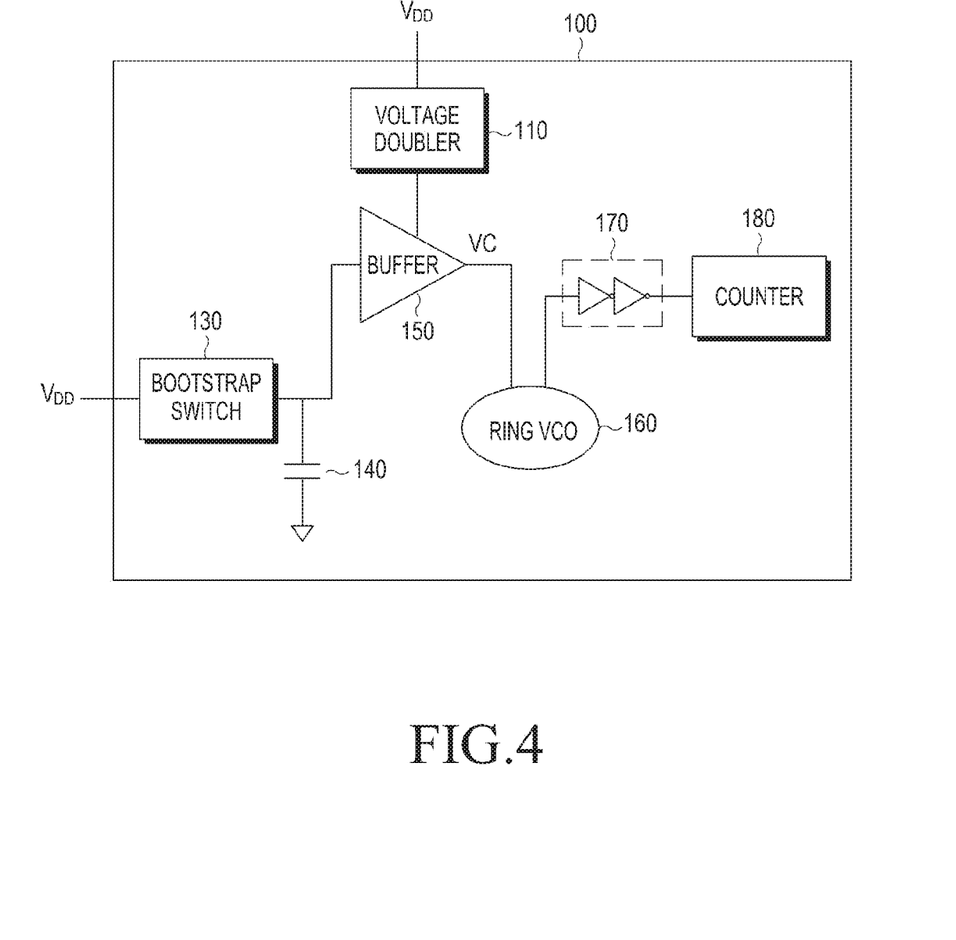
FIG. 4 illustrates a conceptual view for explaining an inspection apparatus according to embodiments of the present disclosure.

FIG. 4 illustrates a conceptual view for explaining an inspection apparatus according to embodiments of the present disclosure.

The inspection apparatus 100 includes a voltage doubler 110, a bootstrap switch 130, a storage capacitor 140, a buffer 150, a ring voltage-controlled oscillator (VCO) 160, a level shifter 170, and a counter 180.

The voltage doubler 110 boosts the voltage of input driving power and outputs the boosted voltage to the buffer 150. The buffer 150 is driven by driving power having the boosted voltage. In addition to the buffer 150, the bootstrap switch 130, the ring VCO 160, the level shifter 170, and the counter 180 may also be driven by power from the voltage doubler 110.

The bootstrap switch 130 receives a signal to be inspected and stores the received signal in the storage capacitor 140. For example, consideration is given to when noise of the signal to be inspected that the bootstrap switch 130 receives has a voltage of $1.2 \times V_{DD}$. The bootstrap switch 130 outputs a signal to be inspected which does not have a voltage of $1.0 \times V_{DD}$ but has a voltage of $1.2 \times V_{DD}$ even in an operating environment corresponding to $V_{DD}$. As described in more detail below, the bootstrap switch 130 includes a voltage boosting circuit, and operates based on the voltage boosting circuit and thereby outputs the signal to be inspected which does not have the voltage of $1.0 \times V_{DD}$ but has the voltage of $1.2 \times V_{DD}$ even in the operating environment corresponding to $V_{DD}$.

The storage capacitor 140 stores the signal from the bootstrap switch 130 during a predetermined time period, and outputs the signal to the buffer 150. For example, the storage capacitor 140 stores the signal from the bootstrap switch 130 during a preset cycle, and then outputs the signal.

The buffer 150 receives and operates with driving power having the voltage boosted by the voltage doubler 110, and outputs a signal having a voltage $V_C$ (e.g., a voltage of $1.2 \times V_{DD}$) of the signal which is output from the bootstrap switch 130.

The ring VCO 160 outputs a square wave having a frequency corresponding to a voltage $V_C$ of a signal from the buffer 150. For example, the square wave, which is output from the ring VCO 160, has a frequency proportional to the voltage $V_C$ of the signal from the buffer 150.

The level shifter 170 shifts the voltage of the square wave, which is output from the ring VCO 160, to a driving voltage $V_{DD}$. The counter 180 counts the number of square waves, and measures a voltage of noise according to a counting result. For example, the ring VCO 160 outputs a square wave having a first frequency so as to correspond to a voltage $V_C$ of a signal having 1.0 V, and outputs a square wave having a second frequency so as to correspond to a voltage $V_C$ of a signal having 1.2 V.

The counter 180 counts a first number by measuring the number of square waves having the first frequency during a first time period, and counts a second number by measuring the number of square waves having the second frequency during the first time period. When the counter 180 counts the first number, the inspection apparatus 100 determines that a signal has a voltage of 1.0 V and that noise has not been generated. When the counter 180 counts the second number, the inspection apparatus 100 determines that the signal has a voltage of 1.2 V and that noise has been generated. The inspection apparatus 100 executes stored software counting result to determine whether noise has been generated, based on the counting. Alternatively, the inspection apparatus 100 delivers the counting result to an external electronic apparatus, which executes the stored software and determines whether noise has been generated, based on the counting result.

As described above, the inspection apparatus 100 boosts a driving voltage to a level, which enables the measurement of noise, by using the voltage doubler 110, enables the bootstrap switch 130 to output the value of an accurate voltage from the subject to be inspected, and thereby measures noise by using one voltage.

Figure 5A:
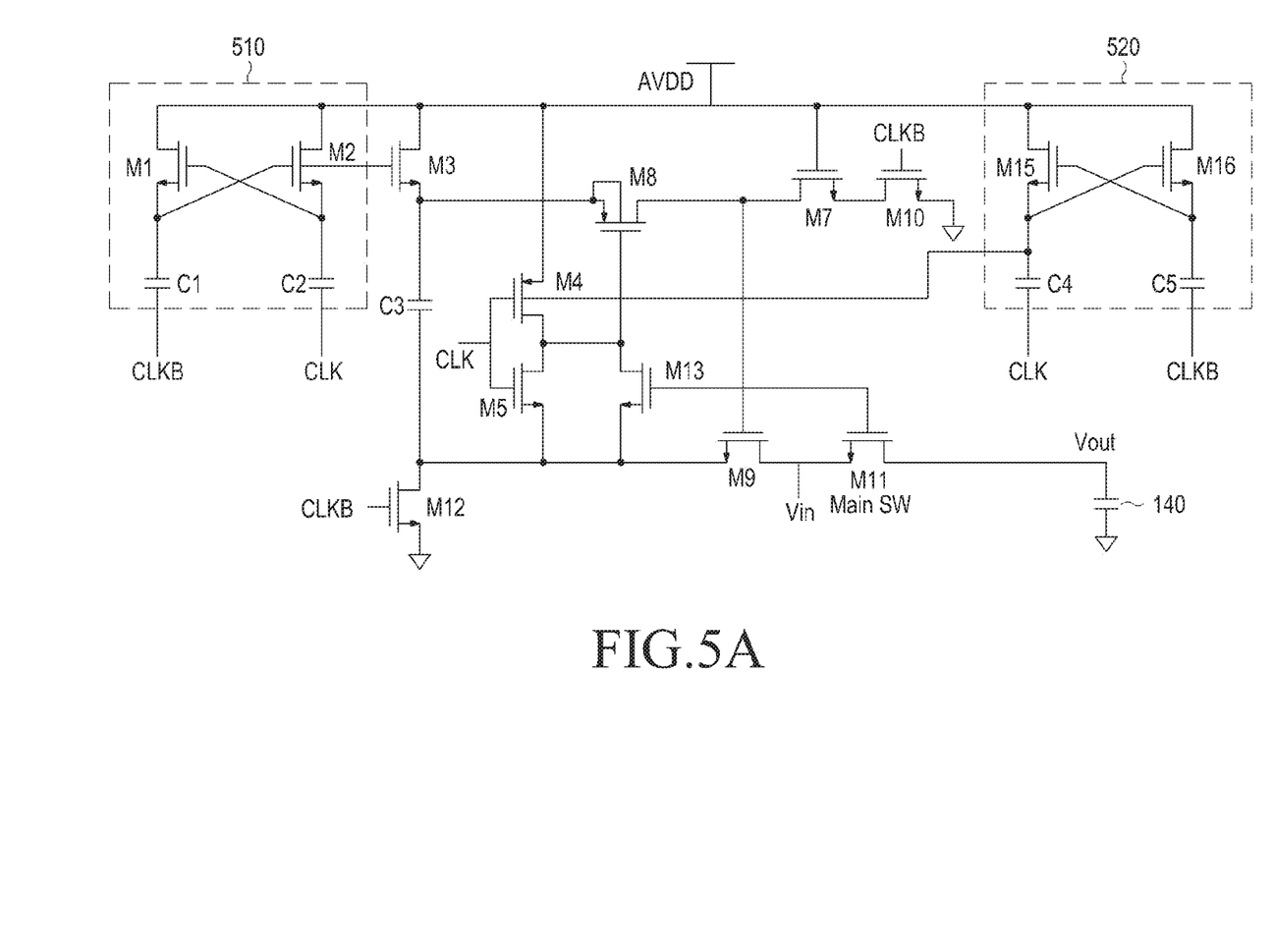
FIGS. 5A and 5B each illustrate a circuit diagram of a bootstrap switch according to embodiments of the present disclosure.
Figure 5B:
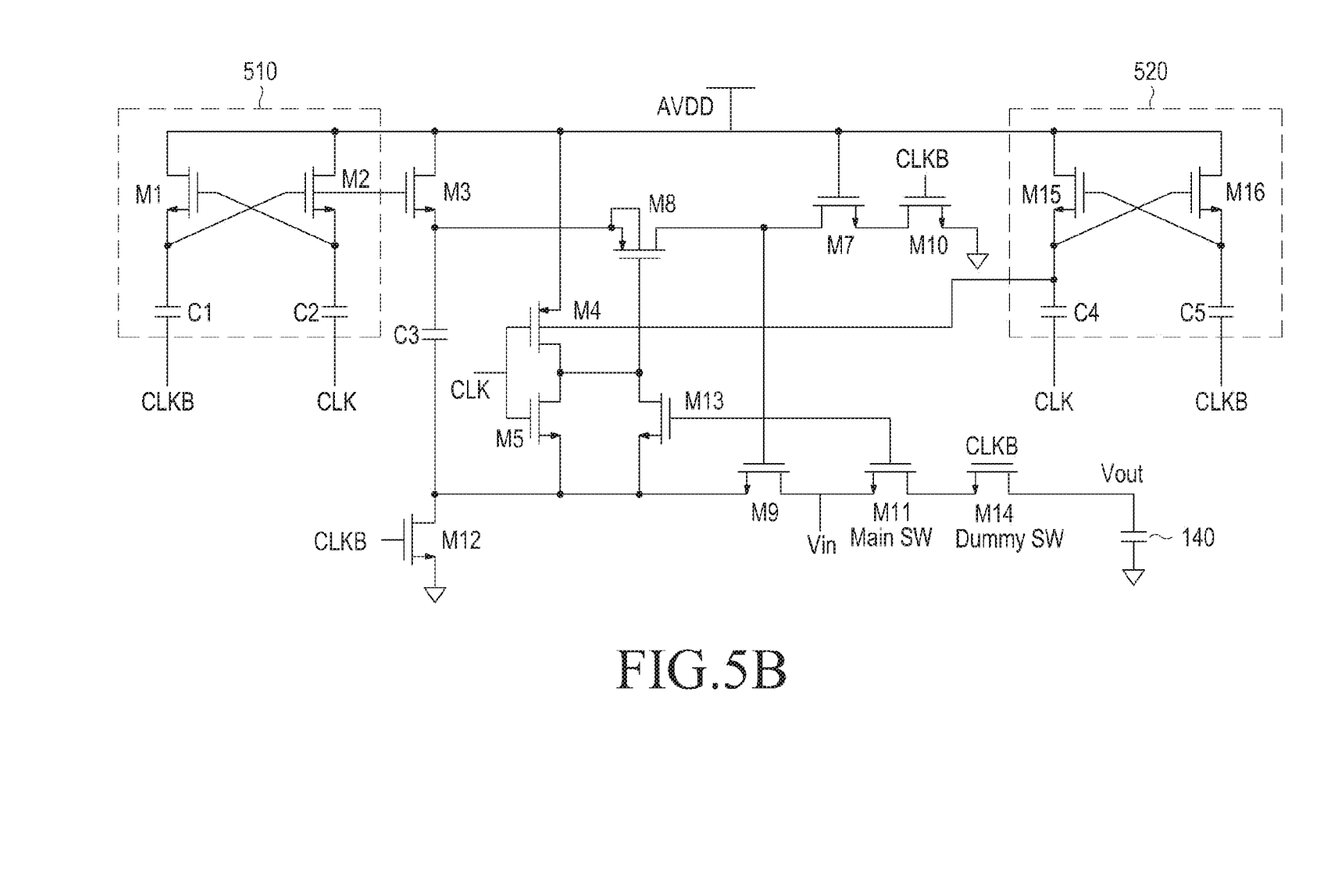

FIGS. 5A and 5B each illustrate a circuit diagram of a bootstrap switch according to embodiments of the present disclosure.

Referring to FIG. 5A, the bootstrap switch includes charge pumping circuits 510 and 520.

The charge pumping circuit 510 includes transistors M1 and M2 and capacitors C1 and C2. More specifically, the charge pumping circuit 510 includes the capacitor C1, of which a CLKB signal is applied to a first terminal and a second terminal is connected to a source terminal of the transistor M1. Driving power AVDD is applied to a drain terminal of the transistor M1, which is connected to a drain terminal of the transistor M2. A gate terminal of the transistor M1 is connected to a source terminal of the transistor M2 and a first terminal of the capacitor C2. A gate terminal of the transistor M2 is connected to the source terminal of the transistor M1 and a first terminal of the capacitor C1. The source terminal of the transistor M2 is connected to the gate terminal of the transistor M1 and a first terminal of the capacitor C2. A CLK signal is applied to a second terminal of the capacitor C2.

The charge pumping circuit 520 includes transistors M15 and M16 and capacitors C4 and C5. More specifically, the charge pumping circuit 520 includes the capacitor C5, of which the CLKB signal is applied to a first terminal and a second terminal is connected to a source terminal of the transistor M16. Driving power AVDD is applied to a drain terminal of the transistor M16, which is connected to a drain terminal of the transistor M15. A gate terminal of the transistor M16 is connected to a source terminal of the transistor M15 and a first terminal of the capacitor C4. A gate terminal of the transistor M15 is connected to the source terminal of the transistor M16 and a first terminal of the capacitor C5. The source terminal of the transistor M15 is connected to the gate terminal of the transistor M16 and a first terminal of the capacitor C4. The CLK signal is applied to a second terminal of the capacitor C4.

The CLK signal and the CLKB signal may be alternately applied to each of the charge pumping circuits 510 and 520, which boost the voltage of the input driving power AVDD. Accordingly, a voltage obtained by boosting the voltage of the input driving power AVDD is applied to a gate terminal and a drain terminal of the transistor M3. Also, latch-up is prevented through the process for boosting a voltage in the charge pumping circuits 510 and 520.

The gate terminal of the transistor M3 is connected to the source terminal of the transistor M1 and the first terminal of the capacitor C1. The driving power AVDD is applied to the drain terminal of the transistor M3. A source terminal of the transistor M3 is connected to a source terminal and of a transistor M8 and a first terminal of a capacitor C3. A second terminal of the capacitor C3 is connected to a drain terminal of a transistor M12, a source terminal of a transistor M5, a source terminal of a transistor M13, and a source terminal of a transistor M9. The CLKB signal is applied to a gate terminal of the transistor M12, and a source terminal of the transistor M12 is grounded.

The driving power AVDD is applied to a source terminal of a transistor M4. The CLK signal is applied to a gate terminal of the transistor M4, and the drain terminal of the transistor M4 is connected to a drain terminal of the transistor M5, a gate terminal of the transistor M8, and a drain terminal of the transistor M13. The drain terminal of the transistor M5 is connected to the drain terminal of the transistor M4, a gate terminal of the transistor M8, and the drain terminal of the transistor M13. The source terminal of the transistor M13 is connected to the drain terminal of the transistor M12, the source terminal of the transistor M5 and a source terminal of the transistor M9.

The gate terminal of the transistor M8 is connected to the drain terminal of the transistor M4, the drain terminal of the transistor M5, and the drain terminal of the transistor M13. The drain terminal of the transistor M8 is connected to a gate terminal of the transistor M9 and a drain terminal of a transistor M7. The source terminal of the transistor M9 is connected to the drain terminal of the transistor M12, the source terminal of the transistor M5, and the source terminal of the transistor M13. The gate terminal of the transistor M9 is connected to the drain terminal of the transistor M8 and a drain terminal of the transistor M7. A signal having a voltage of Vin from a subject to be inspected is applied to the drain terminal of the transistor M9, which is connected to a source terminal of a main switch (SW) at transistor M11.

The drain terminal of the transistor M7 is connected to the drain terminal of the transistor M8 and the gate terminal of the transistor M9. The driving power AVDD is applied to a gate terminal of the transistor M7. The source terminal of the transistor M7 is connected to a drain terminal of a transistor M10. The CLKB signal is applied to a gate terminal of the transistor M10. A source terminal of the transistor M10 is connected to the ground.

The main SW is connected to a gate terminal of the transistor M13, as described above. Also, a voltage applied to the gate terminal of the transistor M13 may exceed the voltage of the driving power AVDD. As described above, the charge pumping circuits 510 and 520 boost the voltage of the applied driving power AVDD, and accordingly, a voltage exceeding that of the driving power AVDD is applied to the gate terminal of the transistor M13. Therefore, the voltage exceeding the voltage of the driving power AVDD may also be applied to a gate terminal of the main SW.

According to the application of the voltage exceeding the voltage of the driving power AVDD to the gate terminal of the main SW, even when Vin of a signal to be inspected, which is applied to the drain terminal of the main SW, exceeds the voltage of the driving power AVDD, a voltage Vout applied to the drain terminal of the main SW may be identical to Vin. Accordingly, even when the voltage of the driving power AVDD of the bootstrap switch is lower than Vin, the bootstrap switch outputs an output voltage Vout identical to the value of Vin, and Vout is temporarily stored in the storage capacitor 140 and is then output to the buffer 150.

FIG. 5B illustrates a circuit diagram of a bootstrap switch according to embodiments of the present disclosure. As compared with FIG. 5A, the bootstrap switch illustrated in FIG. 5B further includes a dummy SW at transistor M14. A CLKB signal is applied to a gate terminal of the dummy SW. Specifically, the dummy SW connects the main SW to the storage capacitor 140 at an output terminal for a time period, during which the CLKB signal is applied to the gate terminal of the dummy SW. The dummy SW disconnects the main SW from the storage capacitor 140 at the output terminal for a time period, during which the CLKB signal is not applied to the gate terminal of the dummy SW. Accordingly, to the present embodiment prevents a charge from being leaked in a direction from the storage capacitor 140 to the main SW for the time period, during which the CLKB signal is not applied to the gate terminal of the dummy SW, and enables noise measurement to be more accurately performed.

Figure 6A:
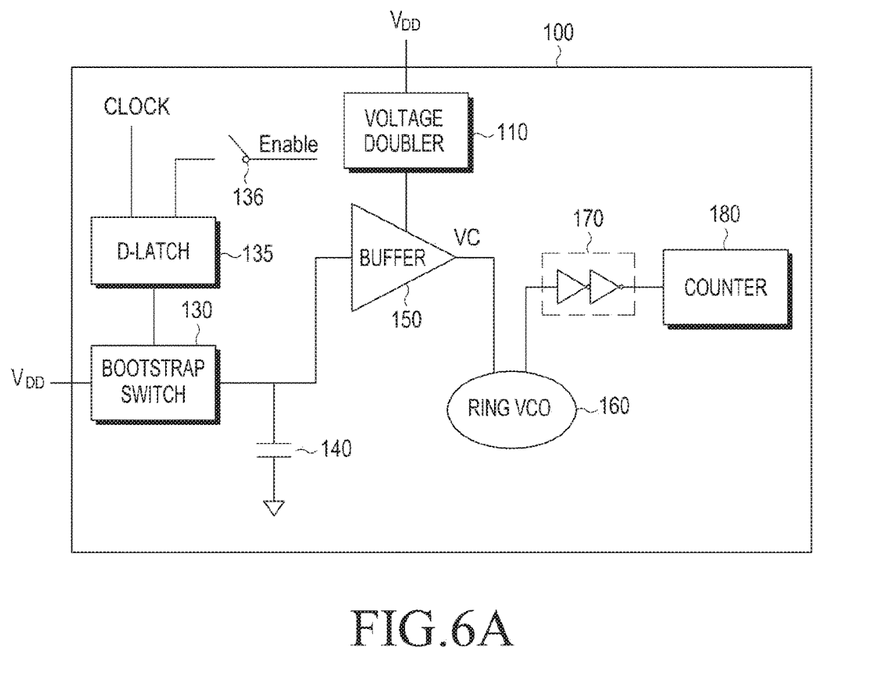
FIG. 6A illustrates a conceptual view of an inspection apparatus according to embodiments of the present disclosure.

FIG. 6A illustrates a conceptual view of an inspection apparatus according to embodiments of the present disclosure.

As compared with FIG. 4, the inspection apparatus 100 illustrated in FIG. 6A further includes a D-latch 135 and a switch 136. A clock signal and an enable signal may be input to the D-latch 135. Due to an operating characteristic of the D-latch 135, the clock signal, which overlaps a time period during which the enable signal is applied to the D-latch 135, is output to the bootstrap switch 130. The bootstrap switch 130 receives a CLK signal and a CLKB signal as input as described above, and receives the CLK signal and the CLKB signal as input based on an output from the D-latch 135.

Particularly, the inspection apparatus 100 controls an on/off timing of the switch 136, and thereby adjusts the time period during which the enable signal is applied to the D-latch 135. Accordingly, the inspection apparatus 100 samples a signal to be inspected.

Figure 6B:
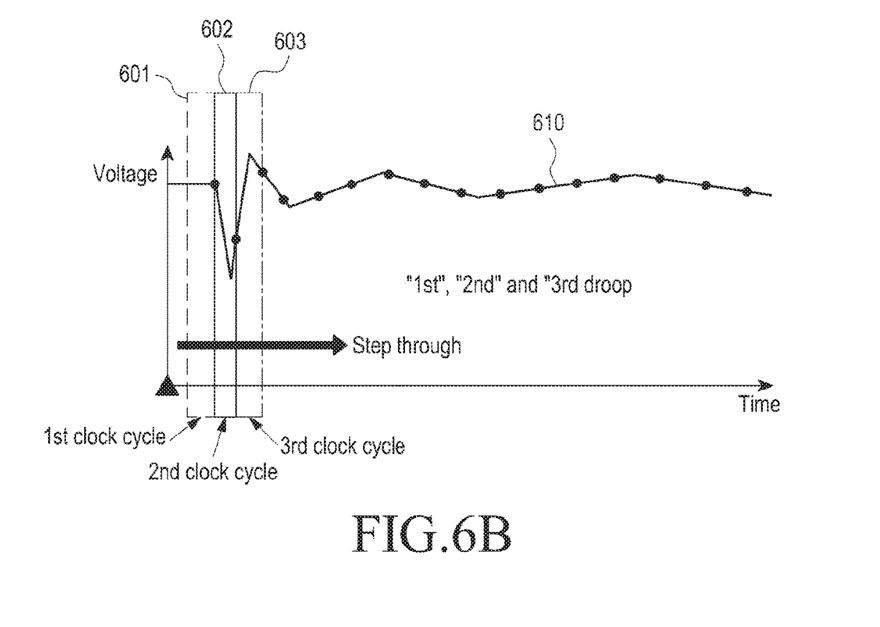
FIG. 6B illustrates a conceptual view for explaining sampling according to embodiments of the present disclosure.

More specifically, referring to FIG. 6B, the inspection apparatus 100 applies the enable signal so as to sequentially sample a 1st clock cycle 601, a 2nd clock cycle 602, and a 3rd clock cycle 603 while a signal 610 from the subject to be inspected is input. The inspection apparatus 100 outputs an on/off control signal over the switch 136 so as to enable sampling to be performed. The inspection apparatus 100 pre-stores or receives, from an external electronic device, software capable of controlling the on/off control signal or the enable signal. A bandwidth for a clock cycle may be determined at each cycle. The on/off control signal or the enable signal may be synchronized with the clock signal.

Figure 7:
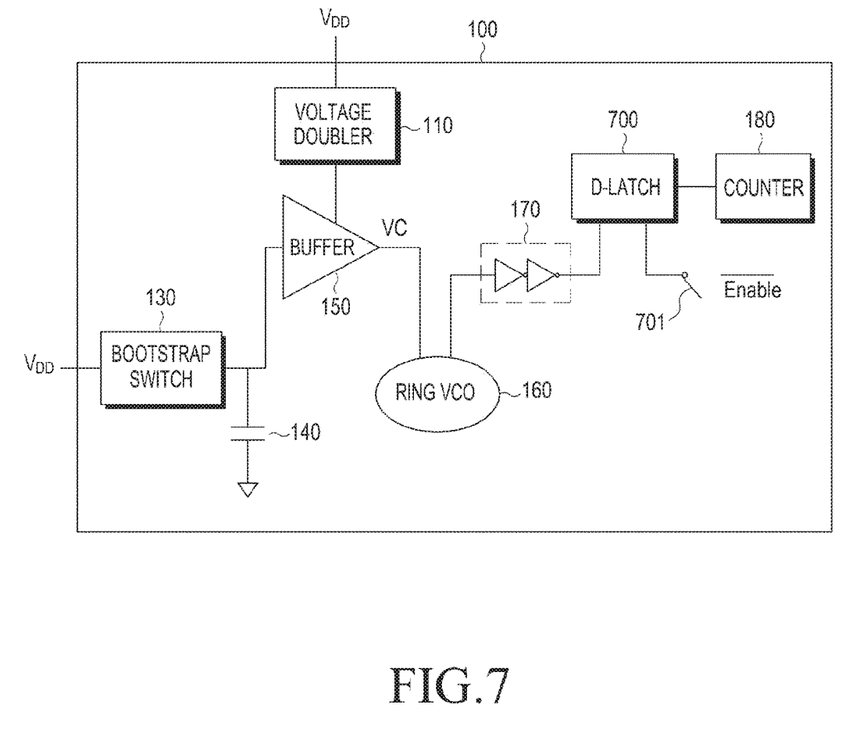
FIG. 7 illustrates a conceptual view of an inspection apparatus according to embodiments of the present disclosure.

FIG. 7 illustrates a conceptual view of an inspection apparatus according to embodiments of the present disclosure.

As compared with the inspection apparatus 100 illustrated in FIG. 4, the inspection apparatus 100 illustrated in FIG. 7 further includes a D-latch 700 and a switch 701. The D-latch 700 is connected to the level shifter 170, and an output terminal of the D-latch 700 is connected to the counter 180. Specifically, the D-latch 700 receives, as input signals, a level-shifted square wave from the level shifter 170 and an enable signal. Due to an operating characteristic of the D-latch 700, the D-latch 700 outputs the level-shifted square wave for a time period during which the enable signal is applied to the D-latch 700. Accordingly, the inspection apparatus 100 determines a sampling time period by adjusting the time period during which the enable signal is applied to the D-latch 700. The inspection apparatus 100 outputs a square wave during the sampling time period, and the counter 180 counts the number of square waves during the sampling time period. The inspection apparatus 100 pre-stores, in the form of a look-up table, relation information between the number of square waves during the sampling time period and a voltage of a signal to be inspected, measures the voltage of the signal to be inspected with reference to a counting result and the look-up table, and accordingly, inspects the subject for whether noise has been generated.

Figure 8:
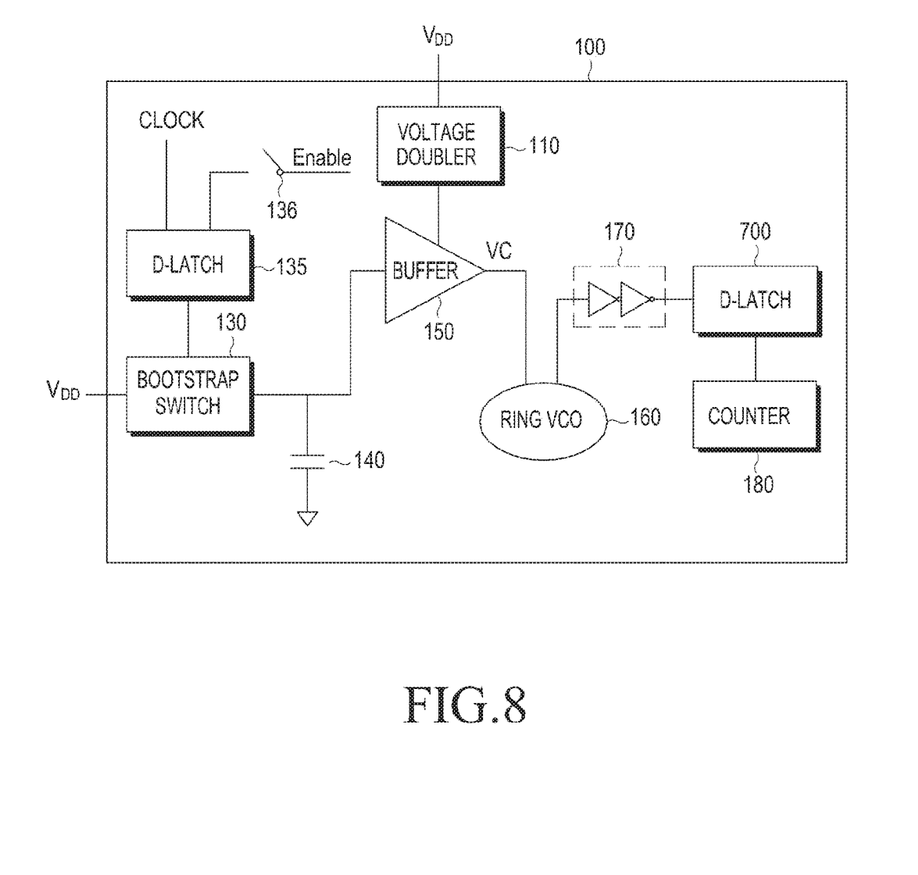
FIG. 8 illustrates a conceptual view of an inspection apparatus according to embodiments of the present disclosure.

FIG. 8 illustrates a conceptual view of an inspection apparatus according to embodiments of the present disclosure.

As compared with the inspection apparatus illustrated in FIG. 7, the inspection apparatus 100 illustrated in FIG. 8 further includes a D-latch 135 and a switch 136. An enable signal applied to the D-latch 135 may be different from an enable signal applied to the D-latch 700, and may be used to sample a signal to be inspected and to prevent the leakage of a charge in a dummy SW. The enable signal applied to the D-latch 700 may be used to determine a sampling time period for a square wave from the level shifter 170.

Figure 9:
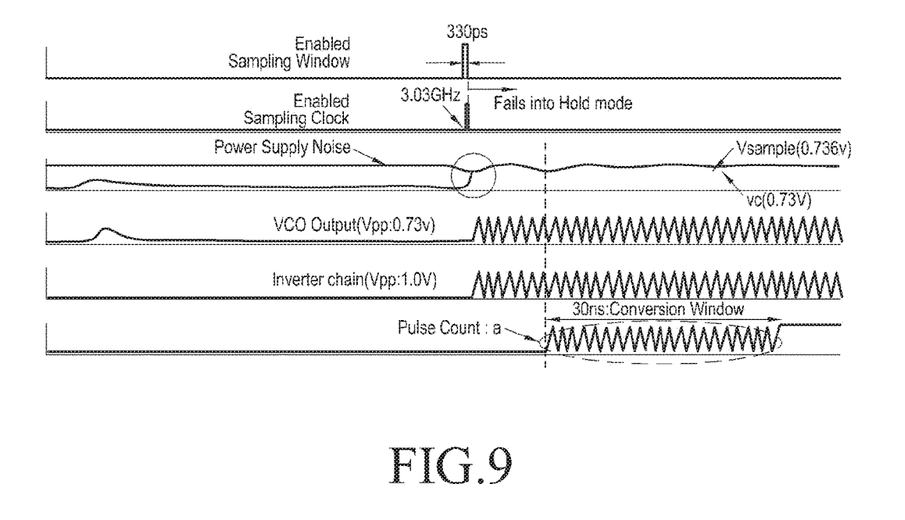
FIGS. 9 and 10 illustrate waveforms of signals according to embodiments of the present disclosure.
Figure 10:
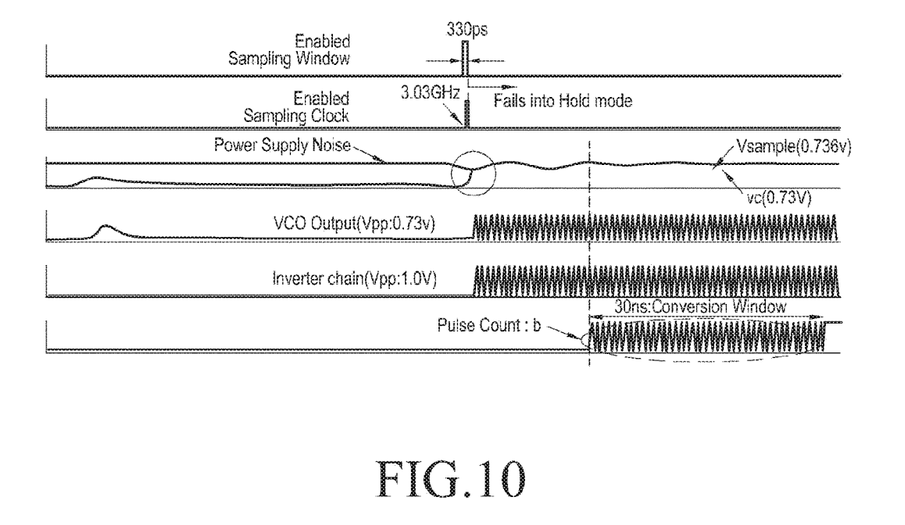

FIGS. 9 and 10 illustrate waveforms of signals according to embodiments of the present disclosure. The graph in FIG. 9 illustrates waveforms when noise having 0.75 V is generated when a signal to be inspected, which is applied to a power line having 1.0 V, is measured while 1.0 V is used as driving power. The graph in FIG. 10 illustrates waveforms when noise having 1.25 V is generated when a signal to be inspected, which is applied to a power line having 1.0 V, is measured while 1.0 V is used as driving power.

In FIG. 9, an enabled sampling window may be an enable signal, or the enable signal may be an on control signal over the switch 401 connected to the D-latch 135 illustrated in FIG. 6A or FIG. 8. As illustrated in FIG. 9, an on time period of the enable signal or a bandwidth of the on control signal over the switch 401 is 330 picoseconds (ps). An enabled sampling clock is an output signal from the D-latch 135 illustrated in FIG. 6A or FIG. 8, and has a frequency of 3.03 gigahertz (GHz), and is held after a sampling cycle by the enabled sampling window. Power supply noise is a signal to be inspected. A part of the power supply noise, which corresponds to the sampling cycle, may be a subject to be inspected.

A VCO output is an output signal from the ring VCO 160, and is a square wave as illustrated in FIG. 9. The VCO output is delayed during a unity-gain buffer delay time period for 15 nanoseconds (ns), for example. The square wave illustrated in FIG. 9 has a voltage value of 0.73 V, and has a first frequency. As described above, the level shifter 170 level-shifts a square wave so as to cause the square wave to correspond to the voltage of the driving power, and an inverter chain is a signal, which is output from the level shifter 170, and has a voltage of 1.0 V.

As described above with reference to FIG. 7 and FIG. 8, the D-latch 700 outputs a square wave during the sampling time period, and a pulse count is the square wave which is output from the D-latch 700. An enable signal is applied to the D-latch 700 for 30 ns. A start point of the enable signal is set in view of the unity-gain buffer delay. The counter 180 counts the number of square waves from the D-latch 700, as illustrated in FIG. 9. The inspection apparatus 100 pre-stores relation information between the number of square waves and a voltage. The inspection apparatus 100 identifies that the number of square waves corresponds to 0.75 V, and accordingly, determines that the voltage of noise is equal to 0.75 V.

In FIG. 10, an enabled sampling window is an enable signal, or the enable signal is an on control signal over the switch 401 connected to the D-latch 135 illustrated in FIG. 6A or FIG. 8. As illustrated in FIG. 10, an on time period of the enable signal or a bandwidth of the on control signal over the switch 401 is 330 ps. An enabled sampling clock is an output signal from the D-latch 135 illustrated in FIG. 6A or FIG. 8, and has a frequency of 3.03 GHz, and may be held after a sampling cycle by the enabled sampling window. Power supply noise is a signal to be inspected. A part of the power supply noise, which corresponds to the sampling cycle, is a subject to be inspected. A VCO output is an output signal from the ring VCO 160, and is a square wave as illustrated in FIG. 10.

The VCO output is delayed during a unity-gain buffer delay time period for 15 ns, for example. The square wave illustrated in FIG. 10 has a voltage value of 1.223 V, and has a second frequency. As illustrated, the second frequency of the square wave illustrated in FIG. 10 is higher than the first frequency of the square wave illustrated in FIG. 9. As described above, the level shifter 170 level-shifts a square wave so as to cause the square wave to correspond to the voltage of the driving power, and an inverter chain is output from the level shifter 170, and has a voltage of 1.0 V.

As described above with reference to FIG. 7 and FIG. 8, the D-latch 700 outputs a square wave during the sampling time period, and a pulse count is the square wave which is output from the D-latch 700. An enable signal is applied to the D-latch 700 for 30 ns. A start point of the enable signal is set in view of the unity-gain buffer delay. The counter 180 counts the number of square waves from the D-latch 700, and counts a b number of square waves as illustrated in FIG. 10. The inspection apparatus 100 pre-stores relation information between the number of square waves and a voltage, determines that the b number of square waves corresponds to 1.75 V, and accordingly, determines that the voltage of noise is equal to 1.75 V. When it is determined that the number of square waves deviates from a preset range, the inspection apparatus 100 determines that noise is included in the signal from the object to be inspected.

In embodiments of the present disclosure, the inspection apparatus for inspecting at least one element of a chip for noise includes an inspection circuit that is connected to a first power line of the chip, to which a first voltage is applied, and receives a signal to be inspected which includes noise having a second voltage, and a voltage doubler that is connected to the first power line and boosts a voltage of driving power having the first voltage, wherein the inspection circuit may be driven by the driving power, of which the voltage is boosted by the voltage doubler, and inspects the at least one element of the chip for the noise of the signal to be inspected.

The inspection circuit may further include a bootstrap switch that receives the signal to be inspected, and outputs the signal to be inspected, which has the second voltage, even when a voltage of the signal to be inspected exceeds the first voltage.

The bootstrap switch operates with the driving power having the first voltage.

The inspection circuit may further include a first D-latch that outputs, to the bootstrap switch, a clock signal for charging pumping by the bootstrap switch.

The first D-latch receives, as input signals, an enables signal and a clock signal for sampling measurement of the signal to be inspected.

The enable signal may be a square wave in an on-state during a clock cycle signal for sampling.

The bootstrap switch includes a storage capacitor that temporarily stores a charge, which is output from the bootstrap switch, and outputs the charge, and a dummy switch that is connected to the storage capacitor and controls on/off based on the clock signal from the first D-latch.

The storage capacitor charges a charge when the dummy switch is turned on, and prevents leakage of the charge from the storage capacitor when the dummy switch is turned off.

The inspection circuit may further include a ring VCO that generates a square wave in response to a voltage of an output signal from the bootstrap switch.

The inspection circuit may further include a counter that counts the number of the square waves from the ring VCO.

The inspection circuit inspects the subject for noise of the signal to be inspected based on a counting result by the counter, or outputs the counting result to another electronic device.

The inspection circuit determines that noise is included in the signal to be inspected, when the counting result exceeds a preset range.

The inspection circuit may further include a level shifter that level-shifts the square wave from the ring VCO, to the first voltage.

The inspection circuit may further include a second D-latch that receives the square wave from the ring VCO and a second enable signal.

The second enable signal may be for determining a sampling time period for the square wave.

Each of the elements of the inspection apparatus according to the present disclosure may be implemented by one or more components and the name of the corresponding component may vary depending on a type of the inspection apparatus. In embodiments, the inspection apparatus may include at least one of the above-described elements. Some of the above-described elements may be omitted from the electronic device, or the inspection apparatus may further include additional elements. Further, some of the components of the inspection apparatus according to the embodiments of the present disclosure may be combined to form a single entity, and thus, may equivalently execute functions of the corresponding elements prior to the combination.

The term "module" used in the present disclosure may refer to a unit including one or more combinations of hardware, software, and firmware. The "module" may be interchangeable with a term, such as a unit, a logic, a logical block, a component, or a circuit. The "module" may be the smallest unit of an integrated component or a part thereof. The "module" may be a minimum unit for performing one or more functions or a part thereof. The "module" may be mechanically or electronically implemented. For example, the "module" according to the present disclosure includes at least one of an application-specific integrated circuit (ASIC) chip, a field-programmable gate array (FPGA), and a programmable-logic device for performing operations which has been known or are to be developed hereinafter.

According to embodiments, at least some of the devices or the method according to the present disclosure may be implemented by a command stored in a computer-readable storage medium in a programming module form. When the command is executed by one or more processors, the one or more processors performs a function corresponding to the command. The computer-readable storage medium may be the memory.

The computer readable recoding medium includes a hard disk, a floppy disk, magnetic media (e.g., a magnetic tape), optical media (e.g., a compact disc read only memory (CD-ROM) and a digital versatile disc (DVD)), magneto-optical media (e.g., a floptical disk), and a hardware device such as a ROM, a random access memory (RAM), or a flash memory. In addition, the program instructions may include high class language codes, which can be executed in a computer by using an interpreter, as well as machine codes made by a compiler. The aforementioned hardware device may be configured to operate as one or more software modules in order to perform the operation of the present disclosure, and vice versa.

The programming module according to the present disclosure includes one or more of the aforementioned components or may further include other additional components, or some of the aforementioned components may be omitted. Operations executed by a module, a programming module, or other component elements according to embodiments of the present disclosure may be executed sequentially, in parallel, repeatedly, or in a heuristic manner. Some operations may be executed according to another order or may be omitted, or other operations may be added.

Embodiments disclosed herein are provided merely to easily describe technical details of the present disclosure and to help the understanding of the present disclosure, and are not intended to limit the scope of the present disclosure. Therefore, it should be construed that all modifications and changes or modified and changed forms based on the technical aspects of the present disclosure fall within the scope of the present disclosure.

While the present disclosure has been shown and described with reference to certain embodiments thereof, it will be understood by those skilled in the art that various changes in form and details may be made therein without departing from the spirit and scope of the present disclosure as defined by the appended claims and their equivalents.

What is claimed is:

1. An inspection apparatus for inspecting at least one element of a chip for noise, the inspection apparatus comprising:
    an inspection circuit that is connected to a first power line among multiple power lines connected the at least one element of the chip, and that receives a signal to be inspected, wherein a first voltage is applied to the first power line and the signal to be inspected includes noise having a second voltage; and
    a voltage doubler that is connected to the first power line and boosts a voltage of driving power having the first voltage,
    wherein the inspection circuit is driven by the driving power, the voltage of the driving power is boosted by the voltage doubler, and the inspection circuit inspects the at least one element of the chip for the noise of the signal to be inspected,
    wherein the inspection circuit comprises a bootstrap switch that receives and outputs the signal to be inspected having the second voltage, and
    wherein a range of the second voltage includes a voltage exceeding the first voltage.

2. The inspection apparatus as claimed in claim 1, wherein the bootstrap switch operates with the driving power having the first voltage.

3. The inspection apparatus as claimed in claim 1, wherein the inspection circuit further comprises a first D-latch that outputs, to the bootstrap switch, a clock signal for charging pumping by the bootstrap switch.

4. The inspection apparatus as claimed in claim 3, wherein the first D-latch receives, as input signals, an enable signal and a clock signal for sampling measurement of the signal to be inspected.

5. The inspection apparatus as claimed in claim 4, wherein the enable signal comprises a square wave in an on-state during a clock cycle signal for sampling.

6. The inspection apparatus as claimed in claim 3, wherein the bootstrap switch comprises:
    a storage capacitor that temporarily stores a charge, which is output from the bootstrap switch, and outputs the charge; and
    a dummy switch that is connected to the storage capacitor and controls on/off of the inspection apparatus based on the clock signal from the first D-latch.

7. The inspection apparatus as claimed in claim 6, wherein the storage capacitor provides a charge when the dummy switch is turned on, and prevents leakage of the charge when the dummy switch is turned off.

8. The inspection apparatus as claimed in claim 1, wherein the inspection circuit further comprises a ring voltage-controlled oscillator (VCO) that generates a square wave in response to a voltage of an output signal from the bootstrap switch.

9. The inspection apparatus as claimed in claim 8, wherein the inspection circuit further comprises a counter that counts a number of the square waves from the ring VCO.

10. The inspection apparatus as claimed in claim 9, wherein the inspection circuit inspects the subject for noise of the signal to be inspected based on a counting result by the counter, or outputs the counting result to another electronic device.

11. The inspection apparatus as claimed in claim 10, wherein the inspection circuit determines that noise is included in the signal to be inspected, when the counting result exceeds a preset range.

12. The inspection apparatus as claimed in claim 9, wherein the inspection circuit further comprises a level shifter that level-shifts the square wave from the ring VCO, to the first voltage.

13. The inspection apparatus as claimed in claim 9, wherein the inspection circuit further comprises a second D-latch that receives the square wave from the ring VCO and a second enable signal.

14. The inspection apparatus as claimed in claim 13, wherein the second enable signal determines a sampling time period for the square wave.

15. A chip comprising:
    a die
    at least one element that is formed on the die; and
    an inspection apparatus that is formed on the die and inspects the at least one element for noise,
    wherein the inspection apparatus comprises:
    an inspection circuit that is connected to a first power line among multiple power lines connected the at least one element of the chip and that receives a signal to be inspected, wherein the first voltage is applied to the first power line and the signal to be inspected includes noise having a second voltage; and
    a voltage doubler that is connected to the first power line and boosts a voltage of driving power having the first voltage,
    wherein the inspection circuit is driven by the driving power, the voltage of the driving power is boosted by the voltage doubler, and the inspection circuit inspects the at least one element for the noise of the signal to be inspected,
    wherein the inspection circuit comprises a bootstrap switch that receives and outputs the signal to be inspected having the second voltage, and
    wherein a range of the second voltage includes a voltage exceeding the first voltage.

* * * * *